US006404354B1

(12) United States Patent
Decker et al.

(10) Patent No.: US 6,404,354 B1
(45) Date of Patent: Jun. 11, 2002

(54) ROTARY CONTROLLER FOR ELECTRICAL OR ELECTRONIC APPARATUSES

(75) Inventors: Peter Decker, Marl; Stefan Hoyler, Bochum; Suleyman Bakacak, Essen; Zoltan Nemeth, Bochum, all of (DE)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/316,353

(22) Filed: May 21, 1999

(30) Foreign Application Priority Data

May 29, 1998 (DE) .......................................... 198 24 149

(51) Int. Cl.[7] .............................................. H03K 17/94

(52) U.S. Cl. ......................... 341/35; 318/626; 318/628; 200/318; 200/320; 200/43.11; 200/43.16

(58) Field of Search ..................... 341/35, 20; 318/628, 318/685, 626; 200/318, 320, 336, 504, 505, 43.11, 43.16

(56) References Cited

U.S. PATENT DOCUMENTS

| | | | | |
|---|---|---|---|---|
| 4,154,125 A | * | 5/1979 | Frank | 200/336 |
| 4,859,922 A | | 8/1989 | Tauchenitz et al. | 318/628 |
| 5,138,329 A | | 8/1992 | Saarnnimo et al. | 343/702 |
| 5,168,982 A | | 12/1992 | Hakanen et al. | 200/342 |
| 5,189,355 A | * | 2/1993 | Larkins et al. | 318/126 |
| 5,266,949 A | | 11/1993 | Rossi | 341/22 |
| 5,408,060 A | | 4/1995 | Muurinen | 200/314 |
| 5,609,244 A | * | 3/1997 | Reiter | 200/43.11 |
| 5,805,084 A | | 9/1998 | Mannisto | 341/22 |
| 5,877,709 A | | 3/1999 | Ala-Lehtimaki et al. | 341/26 |
| 5,998,743 A | * | 12/1999 | Unkel | 200/43.11 |
| 6,060,671 A | * | 5/2000 | Mozer et al. | 200/43.16 |

FOREIGN PATENT DOCUMENTS

| | | |
|---|---|---|
| DE | 1013746 | 3/1956 |
| DE | 3605088 C2 | 11/1987 |
| DE | 4205875 A1 | 9/1993 |
| DE | 19608869 | 9/1997 |
| DE | 19733609 A1 | 2/1999 |
| EP | 0794089 A2 | 9/1997 |
| WO | WO 98/43261 | 10/1998 |

* cited by examiner

*Primary Examiner*—Michael Horabik
*Assistant Examiner*—Albert K. Wong
(74) *Attorney, Agent, or Firm*—Perman & Green, LLP

(57) ABSTRACT

The invention relates to a rotary controller for electrical or electronic apparatuses (21, 22, 23), having a rotating knob (10). In order to offer the user a reference position of the rotating knob (10), with a simple design of the rotary controller, when making a selection between various options or when setting parameters, the invention provides a controllable latching and locking device (15), by means of which the rotating knob (10) can be locked selectively, in order to provide a stop for the rotary movement.

8 Claims, 2 Drawing Sheets

ROTARY CONTROLLER FOR ELECTRICAL OR ELECTRONIC APPARATUSES

Figure 1:
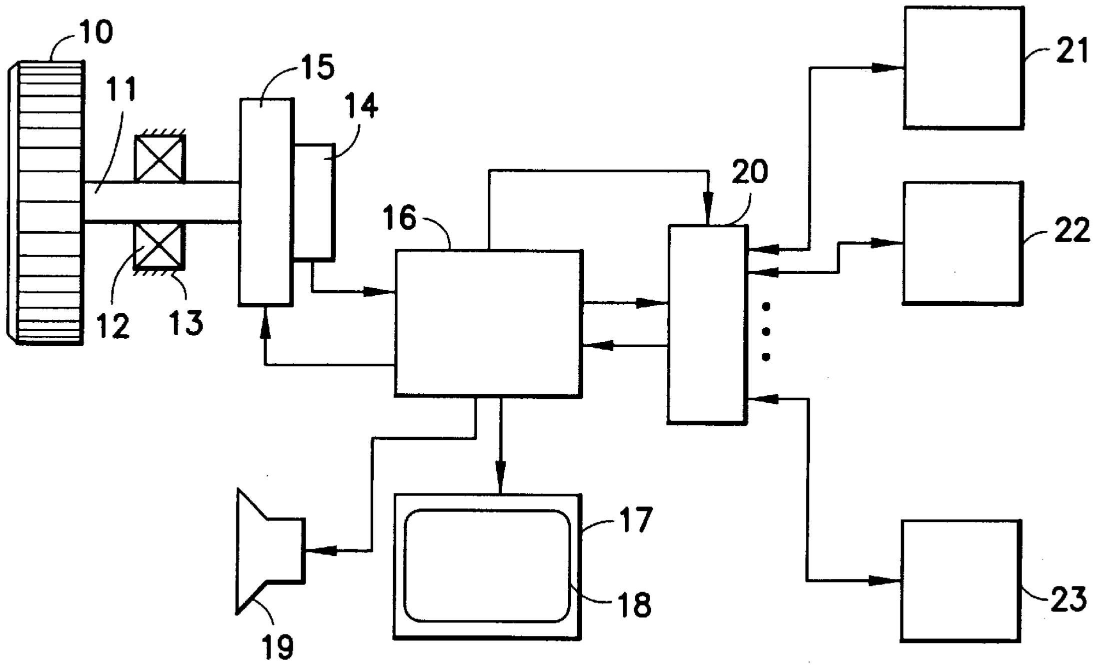

The invention relates to a rotary controller for electrical or electronic apparatuses.

In systems having a plurality of electrical or electronic apparatuses, a single rotary controller is often provided nowadays for a large number of control functions for the individual apparatuses, in order to set parameters or to select between various options, corresponding to a respectively selected control function. If such rotary controllers can rotate freely in both directions, then visual feedback about the parameter or option, respectively, which has been set, is required both when setting parameters and when selecting predetermined options. In order in this case to give the user at least a sensation of the rotation of the rotating knob of the rotary controller, it is known for a multiplicity of slight latching clicks to be produced, which can be sensed on the rotating knob.

Furthermore, a control system for components in a motor vehicle is known (DE 196 08 869 C2), in which an operating means is assigned various control functions and types of tactile feedback. In order to set the tactile feedback, electromechanical and/or electromagnetic actuators are provided, using which it is possible to apply forces to the operating means. In order to indicate that the respective limit value has been reached, the operating means is prevented from being rotated further in the corresponding direction. Further rotation is made somewhat more difficult, in order to indicate a function mean value or latching points.

In the case of a known rotary controller (DE 42 05 875 A1), a rotating knob and an incremental transmitter are arranged on a common shaft, and are connected to a motor via a transmission system. In order to provide latching positions, the motor produces a resetting torque. If the resetting torque of a latching position is overcome, then the motor is actuated such that it provides the resetting torque for the next latching position. In order to provide sprung limit stops, the motor is actuated depending on the rotation position of the rotating knob such that it provides a suddenly increasing resetting torque on reaching the respective limits of setting range.

Furthermore, it is known from DE 36 05 088 C2 for a rotary controller to be assigned various control functions and for an electromagnetic brake to be provided in order to produce various tactile feedbacks, which electromagnetic brake uses a variable resistance to oppose the rotary movement of the rotary controller, and can also simulate latching positions.

In contrast to this, the invention is based on the object of providing a further rotary controller for electrical or electronic apparatuses which, in particular with a simple design, offers the user a reference position when selecting between various options or when setting parameters.

This object is achieved by the rotary controller according to claim 1. Advantageous developments of the invention are described in the dependent claims.

Thus, for a rotary controller having a rotating knob, the invention provides a controllable latching and locking device, by means of which the rotating knob can be locked selectively in order to provide a stop for the rotary movement of the rotating knob. In this case, it is particularly expedient for the latching and locking device to have at least one controllable catch arrangement, which interacts with corresponding latching means which are arranged such that they revolve circumferentially with respect to the rotary movement of the rotating knob.

This allows a reference position for the respective operating function of the rotating knob to be achieved in a particularly simple manner in terms of design, irrespective of the actual rotation position of the rotating knob.

An expedient refinement of the invention is distinguished by two catch arrangements being provided which each act in opposite rotation directions of the rotating knob.

In order to provide the user with one or more reference rotation positions and an improved sensation for the rotary movement in addition to the reference position which can be sensed with the aid of the stop, an advantageous development of the invention provides for each catch arrangement to be controllable such that spring forces of different magnitude can act on it to produce latching clicks which can be sensed with different intensities.

An advantageous development of the invention is distinguished by the latching means (which are arranged circumferentially with respect to the rotary movement of the rotating knob) of the latching and locking device being used as signal initiators for a sensor device for detecting a rotation position and/or a rotation direction of the rotating knob. This refinement of the invention has the advantage that the latching and locking device can be combined with the sensor device, resulting in a particularly compact design. Since the catch arrangement and the sensor device can be arranged offset on the circumference, this allows a particularly short axial physical length to be achieved, in particular. A light barrier arrangement, inductive or capacitive proximity sensors or proximity switches can be used, for example, as a sensor device for detecting the rotation position in this case. Conversely, it is also possible, in the case of a rotary controller which uses a toothed disc as the signal initiator for the sensor device, to use this toothed disc as the latching means for a latching and locking device.

A further simplification of the rotary controller according to the invention is provided if the catch arrangements are designed as rotation direction and rotation angle signal transmitters.

A particularly advantageous refinement of the invention provides that the latching and locking device can be controlled by a user interface in such a manner that each end of a setting or selection range can be sensed by an appropriate stop for the rotary movement, with the stop for the rotary movement being produced by blocking the rotating knob.

Another refinement of the invention is distinguished by the rotation range of the rotating knob being limited to correspond to a number of selection options for a desired control function, in which case each selection option is assigned a latching click for a desired control function, which latching click can be sensed and is produced by the latching and locking device during rotation of the rotating knob.

In this way, particularly if the desired control function consists of selecting between a small number of options, for example three or four options, the rotary controller can be handled like a simple selection switch, so that the user can operate the rotary controller according to the invention in the desired manner, even without a visual and/or audible feedback.

Figure 2:
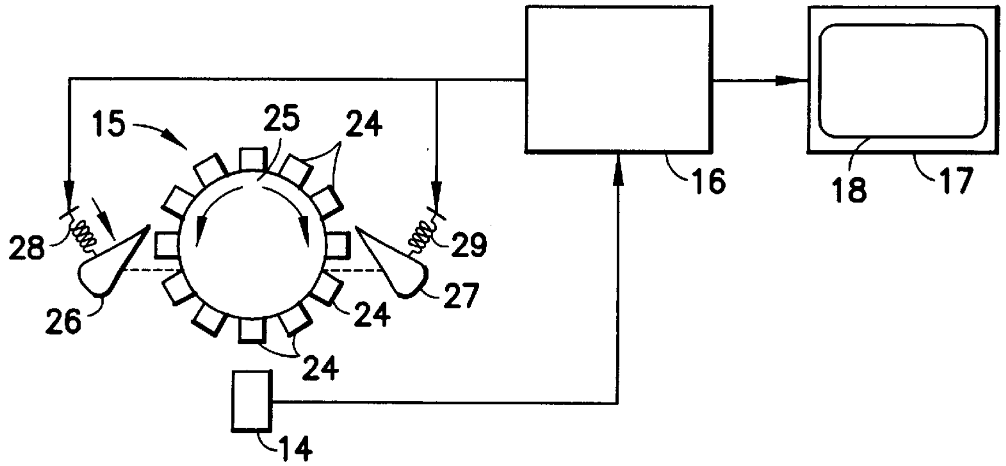
Figure 3A:
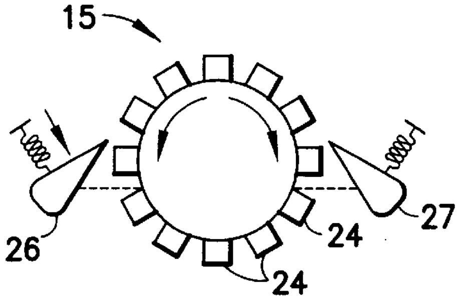
Figure 3B:
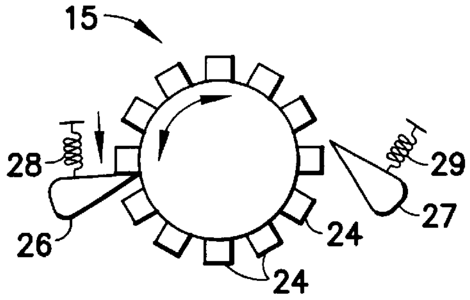
Figure 3C:
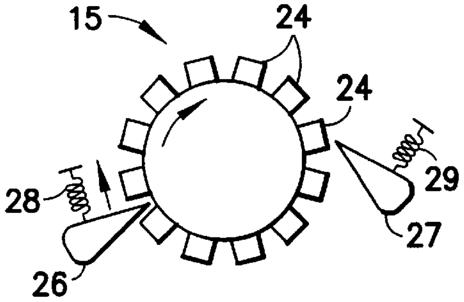
Figure 4:
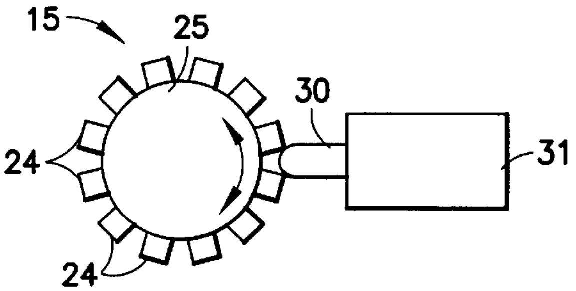

The invention will be explained in the following text using examples and with reference to the drawing, in which:

FIG. 1 shows a simplified schematic block diagram of a rotary controller according to the invention, together with an associated system of electrical or electronic apparatuses, FIG. 2 shows a simplified illustration of a controllable latching and locking device for the rotary controller according to the invention, FIGS. 3(*a*) to (*c*) show various locking states of the latching and locking device according to FIG. 2, and FIG. 4 shows an illustration of a further latching and locking device for the rotary controller according to the invention.

Components and circuit elements which correspond to one another are provided with the same reference symbols in the various figures of the drawing.

As FIG. 1 shows, the rotary controller according to the invention has a rotating knob 10 with a shaft 11, which is mounted in a bearing 12 on a housing 13 that is not illustrated in any more detail. A sensor device 14 for detecting the rotation direction and/or the rotation position of the rotating knob 10, as well as a latching and locking device 15, are arranged on the shaft 11, which latching and locking device 15 allows the rotary movement of the rotating knob 10 to be influenced in various ways in order to limit the rotation range of the rotating knob 10 selectively, to make it possible to sense latching positions and to mark specific positions in a selection range such that they can be sensed by touch.

The latching and locking device 15 is controlled from a user interface 16 as a function of the output signals from the sensor device 14 and of a selected control function. The user interface 16 is connected to a visual display apparatus 17, which comprises, for example, a screen 18, and possibly to an audible signal transmitter 19.

The rotation direction and/or rotation position signals supplied from the sensor device 14 are converted in the user interface 16 into appropriate control or actuating signals depending on the respectively selected control function, and are passed on via a distribution circuit 20 to an electrical or electronic apparatus 21, 22, 23 that is to be controlled. The electrical or electronic apparatus may in this case be, for example, a broadcast radio receiver 21, a CD player, an on-board computer 22, a navigation system 23 or the like. The distribution circuit 20 is in this case controlled from the-user interface 16 as a function of the selected control function and the electronic device 21, 22, 23 to be controlled.

As FIG. 2 shows, the latching and locking device 15 has, for example, a toothed disc 25 which is provided with latching teeth 24 on its external circumference, is arranged coaxially on the shaft 11, and is connected to the shaft 11 such that they rotate together. It is also possible, instead of the toothed disc 25, to provide latching teeth or similar latching means directly on the external circumference of the shaft 11.

Two catches 26, 27, which can be pivoted by means of actuating elements 28, 29, interact with the toothed disc 25. The actuating elements are controlled from the user interface 16, in order selectively to pivot the catches 26, 27 out of the released position shown in FIGS. 2 and 3(*a*) into a locking position. Electromagnets may be provided, for example, in this case as the actuating elements 28, 29. In the locking position, the catches 26, 27 may be held in a sprung manner by forces of different magnitude in one or both rotation directions, in order to make it possible to sense latching clicks of different intensities during operation of the rotating knob.

The latching teeth 24 may also be designed as pulse initiators for the sensor device 14. For example, the latching teeth may be used to interrupt light barriers which can be used as the sensor device 14.

Furthermore, it is feasible to use the catches 26, 27 to detect a rotary movement of the rotating knob 10, by these catches 26, 27 supplying an appropriate signal to the user interface 16, for example for each latching click, by means of a switch or the like.

The operation of the latching and locking device 15 of the rotary controller according to the invention is controlled from the user interface 16 and will now be explained in more detail with reference to FIGS. 3(*a*) to (*c*). FIG. 3(*a*) shows the latching and locking device 15 with the catches 26, 27 held in their released position. This provides a first operating mode for the rotary controller, in which the rotating knob 10 can rotate freely in both directions.

According to FIG. 3(*b*), the catch 26 on the left in the drawing is pivoted to its locking position, in which it interacts with the latching teeth 24 such that it prevents the rotating knob 10 from being rotated anticlockwise, while it is forced back during a rotary movement in the clockwise direction, and returns to its released position shown in FIG. 3*a* in order to allow unimpeded setting movement of the rotating knob 10 in both directions within the setting range again. This results in the rotary controller according to the invention having a configuration which is particularly simple in both design and control terms. In this case, a sprung latching means can also be provided in order to produce latching clicks.

On the other hand, it is also possible for the catch which is located in its locking position according to FIG. 3*b* to be forced back against a spring force produced by the actuating element 28, during a rotary movement in the clockwise direction, in order to snap back to its locking position after a latching tooth 24 has moved past, and thus to produce a click which can be sensed on the rotating knob 10. This allows a limit position for the rotating knob 10 to be marked for a setting or selection range of a selected control function, while the clicking produces a better sensation for the rotary movement. The click which can be sensed can be varied on the rotating knob by means of spring forces of different magnitude produced by the actuating element, in order to mark further rotation positions. The other end of the setting or selection range can then be set by corresponding operation of the catch 27 on the right in the drawing.

FIG. 4 shows another refinement of the latching and locking device 15, in which a single catch 30, which acts in both rotation directions, interacts with the latching teeth 24 on the toothed disc 25. The catch 30 is in this case moved by an actuating element 31 from its released position (which is not shown in any more detail) into a locking position in which it is held elastically by different spring forces, or such that it cannot move, in order to produce latching clicks which can be sensed with different intensities on the rotating knob 10, and/or in order to block further rotary movement of the rotating knob 10 on reaching the limit of a setting or selection range, by which means the corresponding limit of the setting or selection range is once again indicated.

The actuating element 31 shown in FIG. 4 and having the catch 30 can also be used together with the catch arrangement according to FIG. 3 as an additional latching means for producing latching clicks, if the catches 26, 27 have merely the function of indicating the limits of a setting range. In this case, the spring force produced by the actuating element 31 is selected such that it always allows a setting movement with latching clicks which can be sensed with a greater or lesser intensity.

In addition to this indication which can be sensed for the start and end of the setting and selection range, an additional audible signal can also be emitted from the user interface 16 via the audible signal transmitter 19 in order, particularly when making a selection from a multiplicity of options, to indicate that the last selection option has been reached.

The rotary controller according to the invention thus has a variable rotation range, which is set from the user interface 16 by controlling the latching and locking device 15 in a manner corresponding to the setting or selection range for the respective control function. The rotary controller according to the invention can be used in a particularly advantageous manner if there is only a relatively small number of selection options when, for example, controlling a navigation system or when selecting the electrical or electronic apparatuses. In this case, the user recognises the next set selection option by the click which can be sensed on the rotating knob 10, and which is produced by means of the latching and locking device 15 in each position of the rotating knob. Blocking the rotating knob 10 at the start and at the end of a list of selection options allows the start or the end of the list to be selected as a reference, in order to allow a specific selection option to be selected quickly. The respective stop positions of the rotary controller, in which the rotating knob 10 is prevented from rotating further in one direction, are in this case adapted from the user interface 16, corresponding to the number of selection options for the present control function.

What is claimed is:

1. A rotary controller for an electronic apparatus comprising:

a rotary knob;

latching means circumferentially associated with the knob;

a first catch for selectively engaging the latching means; and a locking device for controlling the engagement of the first catch with the latching means to prevent the rotary movement of the knob in one direction.

2. The rotary controller according to claim 1, further comprising:

a second catch which acts in the opposite rotational direction as the first catch.

3. The rotary controller according to claim 1, further comprising:

springs engaged with each catch and controlled by the locking device via actuating elements so that spring forces of different magnitudes produce latching clicks with different intensities.

4. The rotary controller according to claim 1, further comprising:

a sensor for sensing the latching means and outputting a signal that indicates the rotational position and/or rotational direction of the knob.

5. The rotary controller according to claim 2, wherein the locking device is controlled by a user interface to determine the rotation range of the knob and wherein the range is determined by the first and second catches which prevents the rotation of the knob beyond the range.

6. The rotary controller according to claim 5, wherein the knob is used to control a number of functions and wherein the range of the knob corresponds to a particular control function.

7. The rotary controller according to claim 6, further comprising:

springs engaged with each catch and controlled by the locking device via actuating elements so that spring forces of different magnitudes produce latching clicks with different intensities and wherein the click intensities are dependent on the particular control function.

8. The rotary controller according to claim 1, wherein latching means comprises teeth.

* * * * *